United States Patent
Li et al.

(10) Patent No.: US 7,721,246 B2
(45) Date of Patent: *May 18, 2010

(54) METHOD AND APPARATUS FOR QUICKLY DETERMINING THE EFFECT OF PLACING AN ASSIST FEATURE AT A LOCATION IN A LAYOUT

(75) Inventors: Jianliang Li, Hillsboro, OR (US);
Qiliang Yan, Portland, OR (US);
Lawrence S. Melvin, III, Hillsboro, OR (US); Levi D. Barnes, Hillsboro, OR (US); Abani M. Biswas, Beaverton, OR (US); Alakananda A. Biswas, legal representative, Beaverton, OR (US)

(73) Assignee: Synopsys, Inc., Mountain View, CA (US)

( * ) Notice: Subject to any disclaimer, the term of this patent is extended or adjusted under 35 U.S.C. 154(b) by 116 days.

This patent is subject to a terminal disclaimer.

(21) Appl. No.: 11/584,737

(22) Filed: Oct. 19, 2006

(65) Prior Publication Data
US 2007/0038973 A1    Feb. 15, 2007

(51) Int. Cl.
*G06F 17/50* (2006.01)
(52) U.S. Cl. .......................... 716/19; 716/20
(58) Field of Classification Search .............. 716/19–21
See application file for complete search history.

(56) References Cited

U.S. PATENT DOCUMENTS 6,584,609 B1 * 6/2003 Pierrat et al. ................ 716/19

| | | | |
|---|---|---|---|
| 7,421,678 B2 * | 9/2008 | Barnes et al. | 716/21 |
| 2005/0268256 A1 * | 12/2005 | Tsai et al. | 716/4 |
| 2006/0188673 A1 * | 8/2006 | Melvin et al. | 428/34.4 |
| 2006/0206854 A1 * | 9/2006 | Barnes et al. | 716/21 |
| 2007/0168898 A1 * | 7/2007 | Gupta et al. | 716/9 |

OTHER PUBLICATIONS

Yu et al., Process Variation Aware OPC with Variational Lithography Modeling, Design Automation Conference, Jul. 2006.*
Melvin et al., Assist Feature Placement Analysis Using Focus Sensitivity Models, 22nd European Mask and Lithography Conference, Jan. 2006.*
Oh et al., "Resolution Enhancement through Optical Proximity Correction and Stepper Parameter Optimization for 0.12pm Mask Pattern", SPIE Conference on Optical Microlithography XII, SPIE vol. 3679, pp. 607-613, Mar. 1999.*

* cited by examiner

*Primary Examiner*—Vuthe Siek
*Assistant Examiner*—Aric Lin
(74) *Attorney, Agent, or Firm*—Park, Vaughan & Fleming LLP (57) ABSTRACT

One embodiment of the present invention determines the effect of placing an assist feature at a location in a layout. During operation, the system receives a first value which was pre-computed by convolving a model with a layout at an evaluation point, wherein the model models semiconductor manufacturing processes. Next, the system determines a second value by convolving the model with an assist feature, which is assumed to be located at a first location which is in proximity to the evaluation point. The system then determines the effect of placing an assist feature using the first value and the second value. An embodiment of the present invention can be used to determine a substantially optimal location for placing an assist feature in a layout.

18 Claims, 6 Drawing Sheets

METHOD AND APPARATUS FOR QUICKLY DETERMINING THE EFFECT OF PLACING AN ASSIST FEATURE AT A LOCATION IN A LAYOUT

RELATED APPLICATION

This application is related to U.S. Pat. No. 7,251,807, entitled, "METHOD AND APPARATUS FOR IDENTIFYING A MANUFACTURING PROBLEM AREA IN A LAYOUT USING A PROCESS-SENSITIVITY MODEL," by inventors Lawrence S. Melvin III and James P. Shiely filed on 24 Feb. 2005. This application is also related to U.S. patent application Ser. No. 11/109,534, entitled, "METHOD AND APPARATUS FOR DETERMINING AN IMPROVED ASSIST FEATURE CONFIGURATION IN A MASK LAYOUT," by inventors Lawrence S. Melvin III and Benjamin D. Painter filed on 19 Apr. 2005. Additionally, this application is related to U.S. patent application Ser. No. 11/433,595, entitled, "ASSIST FEATURE PLACEMENT USING A PROCESS-SENSITIVITY MODEL," by inventors Levi D. Barnes, Lawrence S. Melvin III, and Benjamin D. Painter filed on 12 May 2006.

BACKGROUND

1. Field of the Invention

The present invention relates to semiconductor manufacturing. More specifically, the present invention relates to a method and apparatus for quickly determining the effect of placing an assist feature at a location in the layout.

2. Related Art

Dramatic improvements in semiconductor manufacturing technologies presently make it possible to integrate tens of millions of devices onto a single chip.

Semiconductor manufacturing technologies typically include a number of processes which involve complex physical and chemical interactions. Since it is almost impossible to find exact formulae to predict the behavior of these complex interactions, researchers typically use process models which are fit to empirical data to predict the behavior of these processes. A process model can be used in a number of applications during the design of a semiconductor chip. For example, process models are commonly used for making corrections to layouts to compensate for undesirable effects of semiconductor manufacturing processes.

One of the important steps in semiconductor manufacturing involves placing assist features in a layout. Assist features (AFs) can be printing (e.g., super-resolution assist features) or non-printing (e.g., sub-resolution assist features). In either case, assist features are meant to improve the robustness (e.g., depth-of-focus) of the layout.

Prior art techniques for placing assist features typically use mask rules, which place and cleanup assist features based on combinations of feature width and spacing parameters. Such rule-based approaches can result in missed or sub-optimal placement and/or cleanup of assist features. Further, the complexity of such rules increases rapidly with shrinking features size, thereby requiring more wafer data for calibration and more effort on the part of engineers. Moreover, these rules can be overly restrictive which can prevent designers from being able to achieve the best semiconductor device performance.

Note that we may be able to determine a good location for placing an assist feature if we can quickly simulate the effect of placing an assist feature at a location in a layout. However, prior art techniques perform at least two full-fledged simulations (one without the assist feature and one with the assist feature) to determine the effect of placing the assist feature at a location.

Unfortunately, performing a full-fledged simulation of a layout can require an infeasible amount of computation (cycles and/or time). As a result, prior art simulation techniques usually cannot be used to determine a good location for placing an assist feature in a layout.

Hence, what is needed is a method and apparatus to quickly determine the effect of placing an assist feature at a location in a layout.

SUMMARY

One embodiment of the present invention provides techniques and systems that can be used to quickly determine the effect of placing an assist feature at a location in a layout. Further, an embodiment can be used to determine a substantially optimal location for placing an assist feature in a layout.

An embodiment substantially reduces the amount of computation required for determining the effect of placing an assist feature in a layout by exploiting the following insight: adding the assist feature to the layout can be treated as a perturbation to the layout.

Specifically, an embodiment can convolve a model, e.g., a process-sensitivity model, with the layout at a number of evaluation points in the layout. Next, the system can store these values in a database which is indexed by the coordinates of the evaluation point. The effect (at an evaluation point) of placing an assist feature at a first location can be quickly determined by: looking-up a first value stored in the database using the coordinates of the evaluation point; quickly determining a second value by convolving the model with the assist feature which is assumed to be placed at the first location; and determining the effect of placing the assist feature using the first value and the second value.

The first value can be viewed as modeling the effect of the layout at the evaluation point (without the assist feature), whereas the second value can be viewed as modeling the effect of a "layout perturbation," i.e., placing the assist feature at the evaluation point. Note that the second value can be determined quickly because the assist feature usually comprises a few simple polygons which can be quickly convolved with the model.

DETAILED DESCRIPTION

Integrated Circuit Design Flow

Figure 1:
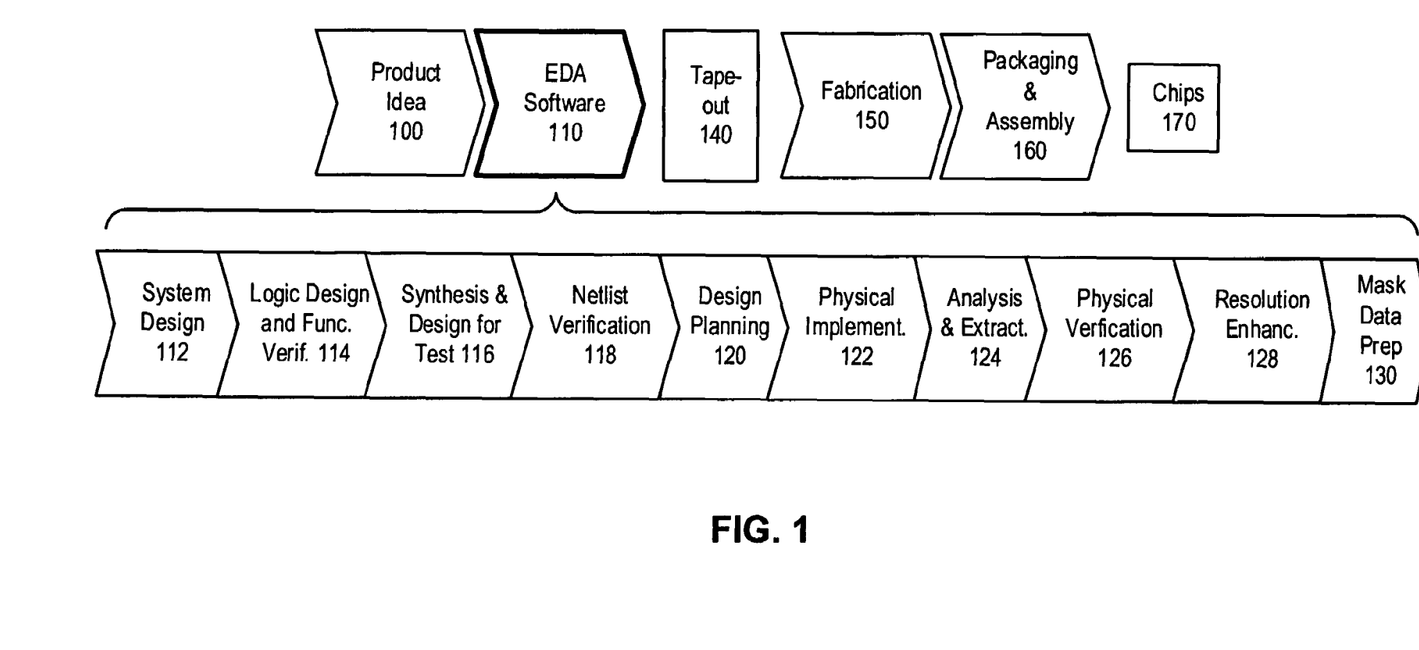
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention.

The process starts with the product idea (step 100) which is realized using an EDA software design process (step 110). When the design is finalized, it can be taped-out (event 140). After tape out, the fabrication process (step 150) and packaging and assembly processes (step 160) are performed which ultimately result in finished chips (result 170).

The EDA software design process (step 110), in turn, comprises steps 112-130, which are described below. Note that the design flow description is for illustration purposes only. This description is not meant to limit the present invention. For example, an actual integrated circuit design may require the designer to perform the design steps in a different sequence than the sequence described below. The following discussion provides further details of the steps in the design process.

System design (step 112): The designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, tests can be designed and implemented to check the finished chips. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro and IC Compiler products.

Physical implementation (step 122): The placement (positioning of circuit elements) and routing (connection of the same) occurs at this step. Exemplary EDA software products from Synopsys, Inc. that can be used at this step include the Astro and IC Compiler products.

Analysis and extraction (step 124): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 126): In this step, the design is checked to ensure correctness for manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include Proteus, ProteusAF, and PSMGen products.

Mask data preparation (step 130): This step provides the "tape-out" data for production of masks to produce finished chips. Exemplary EDA software products from Synopsys, Inc. that can be used at this step include the CATS(R) family of products.

Embodiments of the present invention can be used during one or more of the above described steps. Specifically, one embodiment of the present invention can be used during the resolution enhancement step 128.

Process Variations

Semiconductor manufacturing technologies typically include a number of processes which involve complex physical and chemical interactions. These complex physical and chemical interactions can cause process variations that can cause the characteristics of the actual integrated circuit to be different from the desired characteristics. If this difference is too large, it can lead to manufacturing problems which can reduce the yield and/or reduce the performance of the integrated circuit.

Process variations can arise due to a variety of reasons. For example, in photolithography, variations in the rotation speed of the spindle can cause the resist thickness to vary, which can cause variations in the reflectivity, which, in turn, can cause unwanted changes to the pattern's image. Similarly, bake plates—which are used to drive the solvents out of the wafer and form the pattern in photoresist—can have hot or cold spots, which can cause variations in the critical dimension (CD).

It is helpful to classify process variations into two types: random and systematic. (The term "depth of focus" is often used as a catch all term to describe the amount of random and systematic process variations.) Random process variations are those process variations that are not presently being modeled using a process model. On the other hand, systematic process variations are those process variations that are typically modeled using process models. For example, spindle speed variation is typically classified as a random process variation, while pattern corner rounding has been compensated for in a systematic manner. Researchers are continually trying to convert random process variations into systematic process variations by creating new process models that model random process variations.

Manufacturing Problems

To be economically viable, a semiconductor manufacturing process has to be robust with respect to process variations, i.e., it must be able to tolerate a large enough range of process variations. Improving the robustness or the through-process window directly results in cost savings. This is because improving robustness (e.g., by increasing the depth-of-focus)

reduces the amount of time spent on inspection, servicing, and maintenance of the equipment, thereby increasing the number of wafers that are run. Furthermore, improving the robustness can increase the yield. Due to these reasons, increasing robustness can substantially increase profits.

Moreover, improving robustness even more important as a manufacturing process shifts to smaller dimensions because the inherent depth of focus in these processes becomes rapidly smaller. Specifically, at deep submicron dimensions, even a small improvement in the robustness can save millions of dollars in manufacturing costs.

Assist Features

Sub-resolution assist features (SRAFs) are an effective way to improve through-process robustness (or depth of focus) of lithographic mask patterns by increasing the use of spatial frequency components that are largely insensitive to variations in focus condition to form the desired feature. Corresponding increases in process margin can increase wafer yield and help to stretch existing technology to smaller process nodes. (Although embodiments of the present invention are described in the context of SRAFs, they can be used with other kinds of assist features, or with shifters in alternating phase shift masks. In the remainder of the instant application, unless otherwise stated, the term "assist feature" refers to an SRAF.)

Figure 2:
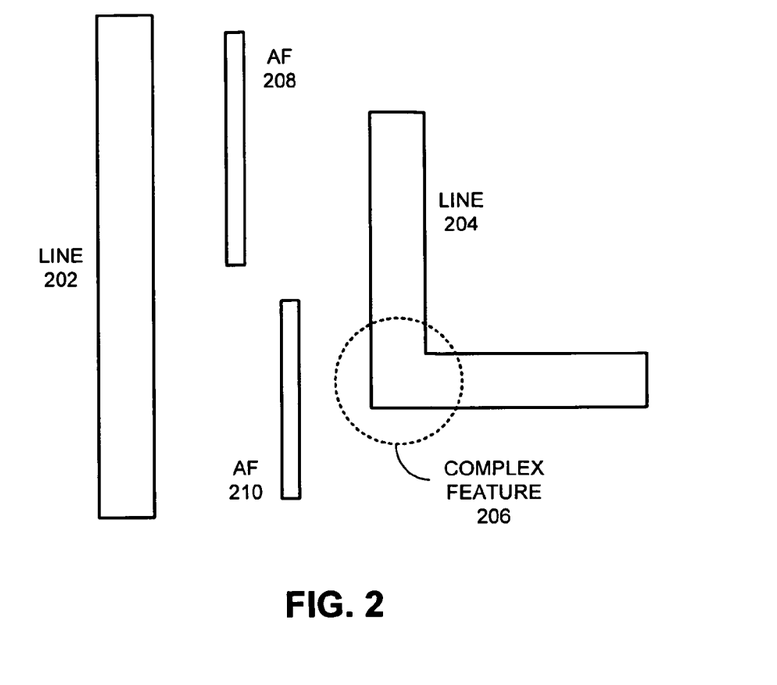
FIG. 2 illustrates assist feature placement in a layout in accordance with an embodiment of the present invention.

FIG. 2 illustrates assist feature placement in a layout in accordance with an embodiment of the present invention.

Lines 202 and 204 are part of a mask layout. Note that line 204 contains complex feature 206. Assist feature placement and/or dimensioning is more challenging when a layout contains complex features. For example, due to the complex feature 206, we may need to place two assist features 208 and 210 that are staggered, instead of just one assist feature. A layout that has multiple lines with varying pitches is another example of a complex layout.

Prior art techniques for placing assist features typically use mask rules that dictate the assist feature placement and dimensioning based on combinations of feature width and spacing parameters.

Figure 3:
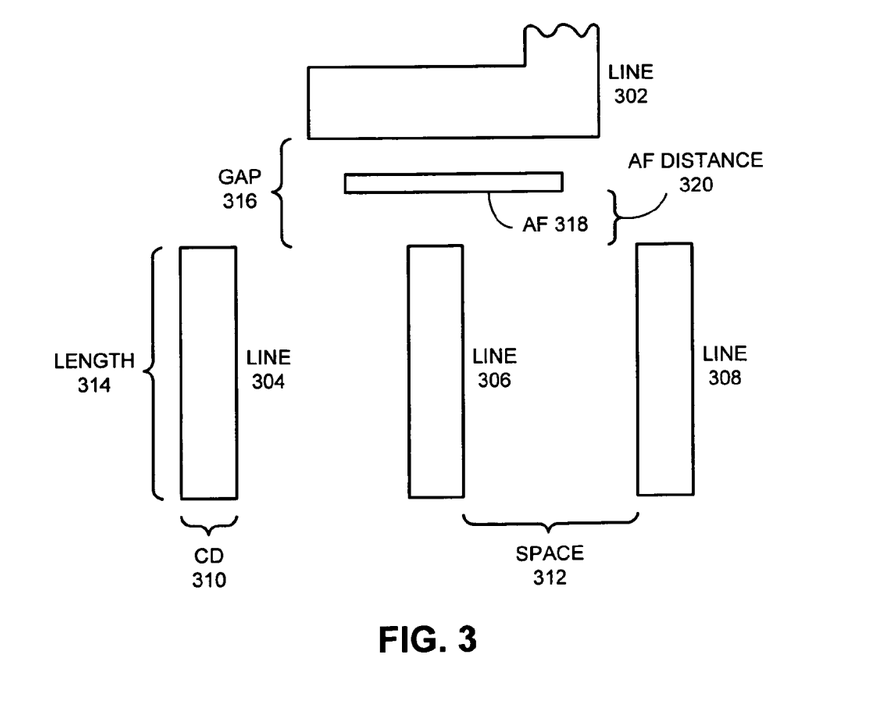
FIG. 3 illustrates assist feature placement using mask rules in accordance with an embodiment of the present invention.

FIG. 3 illustrates assist feature placement using mask rules in accordance with an embodiment of the present invention.

Lines 302, 304, 306, and 308 are part of a mask layout. In a rule-based approach, assist feature (AF) 318 placement/dimensioning can depend on a variety of factors which are organized in the form of a rule table. For example, the AF distance 320 can be determined based on a rule table that includes a variety of factors, such as, the critical dimension (CD) 310, space 312, length 314, and gap 316.

Unfortunately, placing assist features using mask rules can result in missed or sub-optimal placement and/or dimensioning of assist features. Specifically, for large and complex layouts the rule table can become extremely large and unwieldy.

Furthermore, due to the shrinking feature sizes and the increasing complexity of SRAF placement rules, process node calibration is becoming very costly and time consuming. Hence, there is a strong need to quickly and accurately determine the effect of placing an assist feature in a layout.

One embodiment of the present invention provides techniques and systems that can be used to quickly determine the effect of placing an assist feature at a location in a layout. Further, an embodiment can be used to determine a substantially optimal location for placing an assist feature in a layout.

Embodiments of the present invention may be used with any of the five steps in the assist feature placement process, namely, generation of placement rules, initial SRAF placement, resolution of MRC (Mask Rule Check) and other violations, post-placement adjustment of assist features and verification of assist feature effectiveness.

Process-Sensitivity Model

One of the goals of process modeling is to quickly determine all the process variation information at a point on a mask layout. If this can be achieved, one can reduce process variation by appropriately placing assist features, thereby improving the manufacturability of the mask layout. For example, if a designer knows that a line-end is highly sensitive to process variations and is likely to pull back 40 nm during manufacturing, he can use this information to add or adjust an assist feature to avoid the manufacturing problem.

Furthermore, it is very important that one identifies these problem areas without using a substantial amount of computation (cycles and/or time). Theoretically, problem areas may be identified by simulating various process conditions separately and by comparing the resulting patterns to determine areas that can cause manufacturability problems. Unfortunately, this approach is not practical because it will most likely require an infeasible amount of computational resources for running multiple complex simulation models.

Hence, what is needed is a process-sensitivity model that can quickly determine whether an assist feature will improve the stability of a structure within a workable process window. (Note that determining whether a structure is stable or not may depend on the type of the layer. For example, in a metal layer, significant CD variations may be acceptable as long as they do not cause a short or an open in the circuit. In contrast, in a polysilicon layer, even very small CD variations may be unacceptable.)

In one embodiment, the system can determine a process-sensitivity model by first creating an on-target process model that models a semiconductor manufacturing process under nominal process conditions. Note that the semiconductor processing technology can include photolithography and/or etch.

Next, the system can create one or more off-target process models that model the semiconductor manufacturing process under one or more process conditions that are different from nominal process conditions.

Specifically, an on-target (or off-target) process model can be represented by a multidimensional function. Moreover, an on-target (or off-target) process model can be approximated using a set of basis functions or kernels. Furthermore, in one embodiment, creating an on-target process model involves fitting a process model to process data for the semiconductor manufacturing process under nominal process conditions. Likewise, creating the one or more off-target process models can involve fitting a process model to process data for the semiconductor manufacturing process under process conditions that are different from nominal process conditions. Additionally, in one embodiment, the one or more off-target process models can be created by perturbing the on-target process model.

Figure 4A:
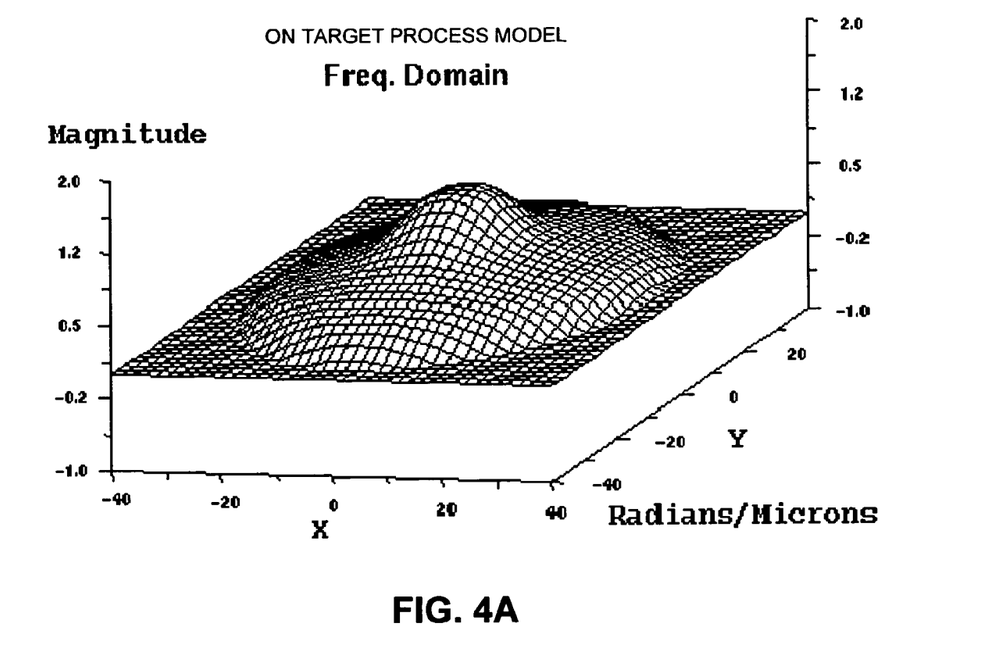
FIG. 4A illustrates a plot of a 2-D function that represents an on-target process model in accordance with an embodiment of the present invention.

FIG. 4A illustrates a plot of a 2-D function that represents an on-target process model in accordance with an embodiment of the present invention.

Figure 4B:
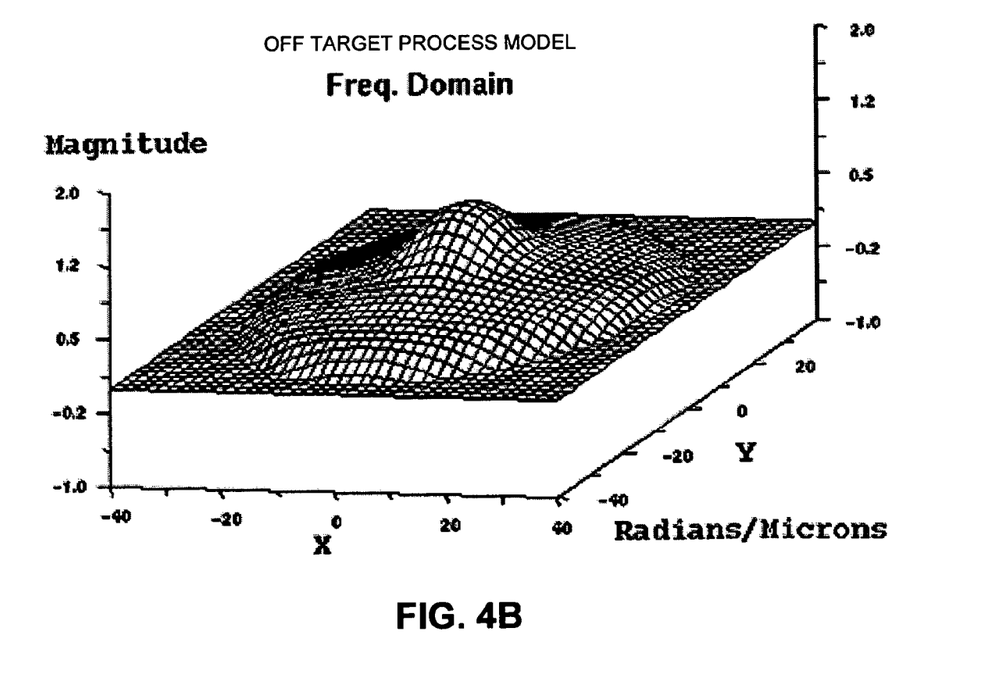
FIG. 4B illustrates a plot of a 2-D function that represents an off-target process model in accordance with an embodiment of the present invention.

FIG. 4B illustrates a plot of a 2-D function that represents an off-target process model in accordance with an embodiment of the present invention.

Figure 4C:
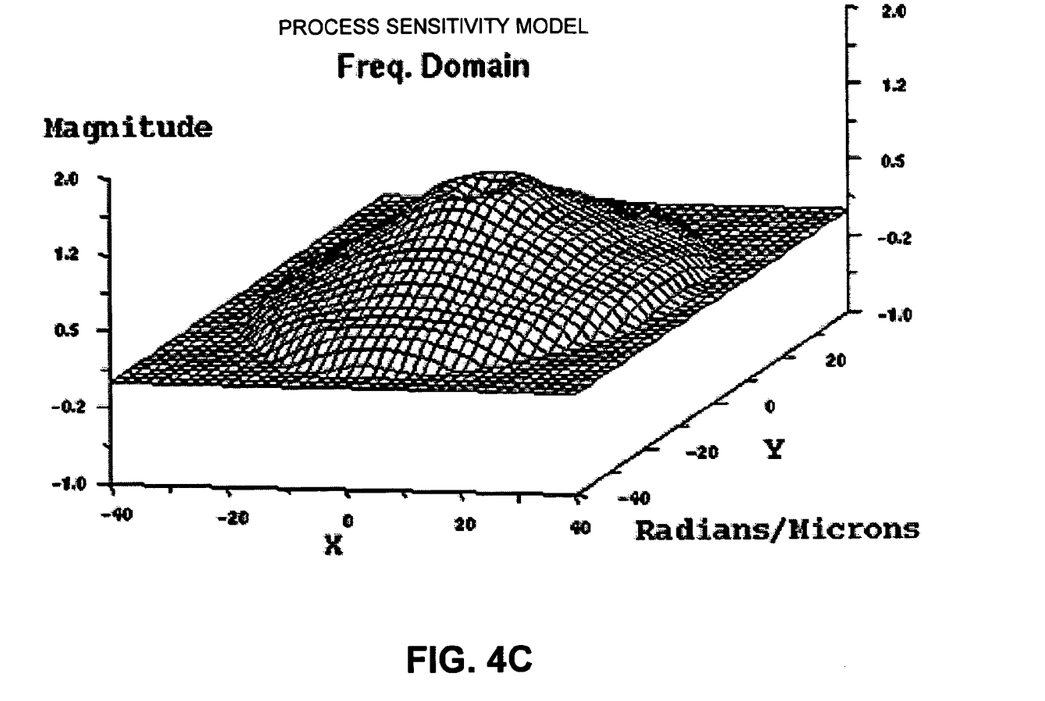
FIG. 4C illustrates a plot of a process-sensitivity model in accordance with an embodiment of the present invention.

FIG. 4C illustrates a plot of a process-sensitivity model in accordance with an embodiment of the present invention.

The 2-D functions illustrated in FIG. 4A and FIG. 4B represent the on-target and the off-target process models, respectively, in the spatial frequency domain. The X and Y axes in FIG. 4A, FIG. 4B, and FIG. 4C, identify a spatial-frequency component (in units of radians per micron), whereas the Z axis indicates the magnitude of a specific spatial-frequency component. However, the present invention is not limited to these representations. Specifically, process models may be represented in other domains, such as the space domain. Additionally, process models may be represented in other coordinates, such as polar coordinates.

Let us look at an example of how we can create a process-sensitivity model for photolithography. Let $P_t$ represent an on-target process model, i.e., let $P_t$ model the optical lithography process when it is in focus, and let $P_d$ represent an off-target process model, e.g., let $P_d$ model the optical lithography process when it is defocused. Now, the process-sensitivity model, $F_p$, can be determined as follows: $F_p=(P_t-P_d)/\Delta P_d$, where $\Delta P_d$ is the focus offset (in units of length).

In the above example, we only considered a single off-target process model. However, we can have two or more off-target process models. In general, the process-sensitivity model, $F_p$, can be determined as follows:

$$F_p = \frac{1}{n}\left(\frac{1}{\Delta P_1}(P_t - P_1) + \frac{1}{\Delta P_2}(P_t - P_2) + \ldots + \frac{1}{\Delta P_n}(P_t - P_n)\right),$$

where, $P_{1\ldots n}$ are off-target process models that model arbitrary (e.g., defocus) process conditions, $P_t$ is the on-target process model that models a nominal (e.g., best focus) process condition, and $\Delta P_{1\ldots n}$ are the respective changes in the process conditions between the nominal process condition and the arbitrary $(1 \ldots n)$ process conditions.

For example, let $P_t$ model the optical lithography process when it is in focus. Furthermore, let $P_{dn}$ model the optical lithography process when it is negatively defocused, i.e., the distance between the lens and the wafer is less than the on-target distance. Additionally, let $P_{dp}$ model the optical lithography process when it is positively defocused, i.e., the distance between the lens and the wafer is larger than the on-target distance. Now, the process-sensitivity model, $F_p$, can be determined as follows:

$$F_p = \frac{1}{2}\left(\frac{(P_0 - P_{dn})}{\Delta P_{dn}} + \frac{(P_0 - P_{dp})}{\Delta P_{dp}}\right),$$

where $\Delta P_{dn}$ and $\Delta P_{dp}$ are the negative and positive focus offsets (in units of length).

Note that $(P_t-P_{dn})/\Delta P_{dn}$ and $(P_t-P_{dp})/\Delta P_{dp}$ model the pattern features that are lost during negative and positive defocusing, respectively. In the above example, we determine the process-sensitivity model, $F_p$, by adding $(P_t-P_{dn})/\Delta P_{dn}$ and $(P_t-P_{dp})/\Delta P_{dp}$, and by dividing by 2 to normalize the process-sensitivity model. (Note that the process-sensitivity model can also be used without normalization.)

Quickly Determining the Effect of a Perturbation on the Aerial Image Intensity

Figure 5:
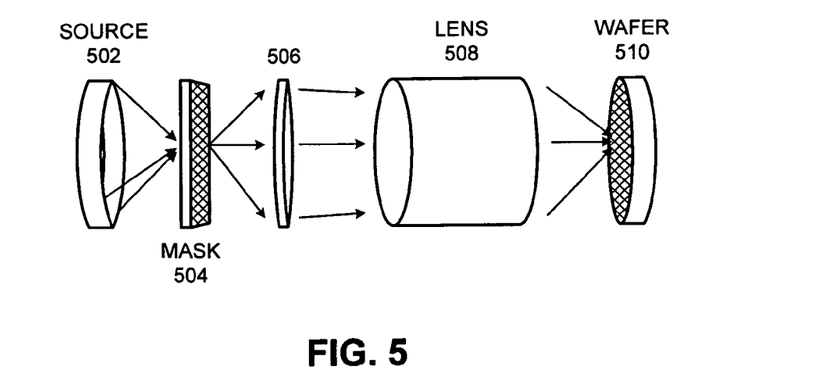
FIG. 5 illustrates a typical optical system in accordance with an embodiment of the present invention.

FIG. 5 illustrates a typical optical system in accordance with an embodiment of the present invention.

Radiation from source 502 passes through mask 504, lens aperture 506, lens body 508, and images on wafer 510.

Traditionally, the Hopkins model has been used to model these optical system components. General information on photolithography and the Hopkins model can be found in Alfred Kwok-Kit Wong, *Optical Imaging in Projection Microlithography*, SPIE-International Society for Optical Engine, 2005, and Grant R. Fowles, *Introduction to Modern Optics*, $2^{nd}$ Edition, Dover Publications, 1989.

Specifically, using the Hopkins model, the aerial image intensity can be expressed as:

$$I(x,y)=\iiiint M(x_1,y_1)T(x-x_1,y-y_1;x-x_2,y-y_2)M^*(x_2,y_2)dx_1dx_2dy_1dy_2,$$

where $M(x, y)$ is the 2-D (two dimensional) mask transmission function, $M^*$ is the complex conjugate of M, and $T(x-x_1, y-y_1; x-x_2, y-y_2)$ is a 4-D (four dimensional) matrix called the Transmission Cross Coefficient (TCC) matrix which models the optical system. The TCC matrix can be represented using a set of orthogonal 2-D (two dimensional) kernels. Specifically, the set of orthogonal kernels can be determined using the eigenvectors of the TCC matrix. The features on the wafer can be determined by convolving the set of 2-D kernels with the mask.

In one embodiment the TCC is given by:

$$T(x-x_1,y-y_1;x-x_2,y-y_2)=J_0(x_1-x_2,y_1-y_2)P(x_1,y_1)P^*(x_2,y_2),$$

where $J_0(x, y)$ is the 2-D mutual intensity function that describes the coherent properties of the illumination system, $P(x, y)$ is the 2-D coherent point spread function that represents the properties of the projection system, and $P^*$ is the complex conjugate of P.

The TCC can be represented using its eigenvectors as follows:

$$T(x_1, y_1; x_2, y_2) = \sum_{i=1}^{\infty} \lambda_i K_i(x_1, y_1) K_i^*(x_2, y_2),$$

where $\lambda_i$ is the eigenvalue corresponding to the eigenvector $K_i(x, y)$ and $K_i^*$ is the complex conjugate of $K_i$.

The aerial image intensity $I(x, y)$ can be represented using the TCC's eigenvalues and eigenvectors as follows:

$$I(x, y) = \sum_{i=1}^{\infty} \lambda_i \left| \int\int M(x_1, y_1) K_i(x - x_1, y - y_1) dx_1 dy_1 \right|^2.$$

Note that each eigenvector $K_i$ can be viewed as the transfer function for a coherent imaging system. The aerial image intensity $I(x, y)$ can be viewed as the sum of the images produced by an infinite number of coherent systems.

Prior art techniques determine the effect of placing an assist feature by comparing two aerial images: the first aerial image is generated using only the layout, and the second aerial image is generated using the layout with the assist feature placed at a specific location in the layout. However, these prior art techniques require at least two full-blown simulations for each assist feature placement, which can require an infeasible amount of computation.

Note that prior art techniques treat adding an assist feature to the layout to be equivalent to creating a new layout. As a result, prior art techniques perform at least one full-blown simulation each time an assist feature is placed at a candidate location.

In contrast, one embodiment of the present invention substantially reduces the amount of computation required for simulation by exploiting the following insight: adding an assist feature to a layout can be treated as a perturbation to the layout, which may not require a full-blown simulation to be performed.

Specifically, the mask transmission function of the layout with the assist feature can be expressed as:

$$M_{AF}(x,y;x_0,y_0) = M(x,y) + \delta M(x-x_0, y-y_0),$$

where, $M_{AF}(x, y; x_0, y_0)$ is the overall mask transmission function of the layout with an assist feature which is placed at a location $(x_0, y_0)$, $M(x, y)$ is the mask transmission function of the mask layout without the assist feature, and $\delta M(x-x_0, y-y_0)$ is the mask transmission function of the assist feature which is placed at location $(x_0, y_0)$.

The aerial image intensity of the layout with the assist feature perturbation can be represented as follows:

$$\begin{aligned} I_{AF}(x, y; x_0, y_0) &= \sum_{i=1}^{\infty} \lambda_i \\ &\quad \left| \int\int M_{AF}(x_1, y_1; x_0, y_0) K_i(x-x_1, y-y_1) dx_1 dy_1 \right|^2 \\ &= \sum_{i=1}^{\infty} \lambda_i \left| \int\int [M(x_1, y_1) + \delta M(x_1-x_0, y_1-y_0)] \right. \\ &\quad \left. K_i(x-x_1, y-y_1) dx_1 dy_1 \right|^2 \\ &\cong \sum_{i=1}^{\infty} \lambda_i \left| \int\int M(x_1, y_1) K_i(x-x_1, y-y_1) dx_1 dy_1 \right|^2 + \\ &\quad \sum_{i=1}^{\infty} 2\lambda_i \int\int M(x_1, y_1) K_i(x-x_1, y-y_1) dx_1 dy_1 \cdot \\ &\quad \int\int \delta M(x_1-x_0, y_1-y_0) K_i(x-x_1, y-y_1) dx_1 dy_1 \\ &= I(x, y) + \delta I(x-x_0, y-y_0), \end{aligned}$$

where, $$\begin{aligned} \delta I(x-x_0, y-y_0) &= \sum_{i=1}^{\infty} 2\lambda_i \int\int M(x_1, y_1) K_i(x-x_1, y-y_1) dx_1 dy_1 \cdot \\ &\quad \int\int \delta M(x_1-x_0, y_1-y_0) K_i(x-x_1, y-y_1) dx_1 dy_1 \\ &= \sum_{i=1}^{\infty} 2\lambda_i E_i(x, y) \cdot \delta E_i(x-x_0, y-y_0). \end{aligned}$$

Note that the second order term was ignored in the above derivation because it is expected to be numerically insignificant compared to the other two terms.

Recall that each eigenvector $K_i$ can be viewed as the transfer function for a coherent imaging system. In the above expression, $E_i(x, y)$ can be viewed as the electric field that is generated when the coherent imaging system associated with $K_i$ is incident on the mask layout M. Similarly, $\delta E_i(x-x_0, y-y_0)$ can be viewed as the electric field that is generated when the coherent imaging system associated with $K_i$ is incident on the assist feature $\delta M$.

In other words, $\delta I(x-x_0, y-y_0)$, which is the effect on the aerial image intensity at the evaluation point $(x, y)$, can be viewed as the weighted sum of the products of the electrical fields associated with the layout and with the assist feature which is placed at $(x_0, y_0)$.

Computing electric field components $E_i(x, y)$, which are associated with the layout, can require a substantial amount of computation because they involve a convolution between the $K_i$ eigenvectors (or kernels) and the layout $M(x, y)$. Hence, these electric field components can be pre-computed and stored in a database so that they can be quickly looked-up during run time using the location of the evaluation point.

Note that determining the value of an electric field component at an evaluation point may require interpolation between two or more pre-computed values.

On the other hand, the electric field components $\delta E_i(x-x_0, y-y_0)$ can be quickly computed during run-time because they involve a convolution between the $K_i$ eigenvectors (or kernels) and the assist feature perturbation which typically contains a few simple polygons.

In summary, the system can quickly determine the effect of placing an assist feature at location $(x_0, y_0)$ by: receiving the pre-computed $E_i(x, y)$ values; quickly computing the $\delta E_i(x-x_0, y-y_0)$ values; and determining the value of $\delta I(x-x_0, y-y_0)$ by quickly computing a weighted sum of the products of the $E_i(x, y)$ values and the $\delta E_i(x-x_0, y-y_0)$ values.

Note that the present invention is not limited to determining the effect on the aerial image intensity. In general, the present invention can be used to substantially speed up computation of any quantity that can be determined by convolving the layout with a set of kernels.

For example, the present invention can be used to determine the effect on the process-sensitivity at an evaluation point when an assist feature is placed at a candidate location in the layout. A process-sensitivity model can be convolved with the layout at a number of locations in the layout and the resulting values can be stored in a database which is indexed using the 2-D coordinates of the locations. During operation, the system can quickly determine the effect of placing an assist feature by: receiving a first value which is determined by looking-up one or more pre-computed values using the coordinates of the evaluation point; determining a second value by quickly convolving the process-sensitivity model with the assist feature; and determining the effect of placing the assist feature using the first value and the second value.

A general technique for quickly determining the effect of placing an assist feature in a layout is described below.

Determining the Effect of Placing an Assist Feature at a Location in a Layout

Figure 6:
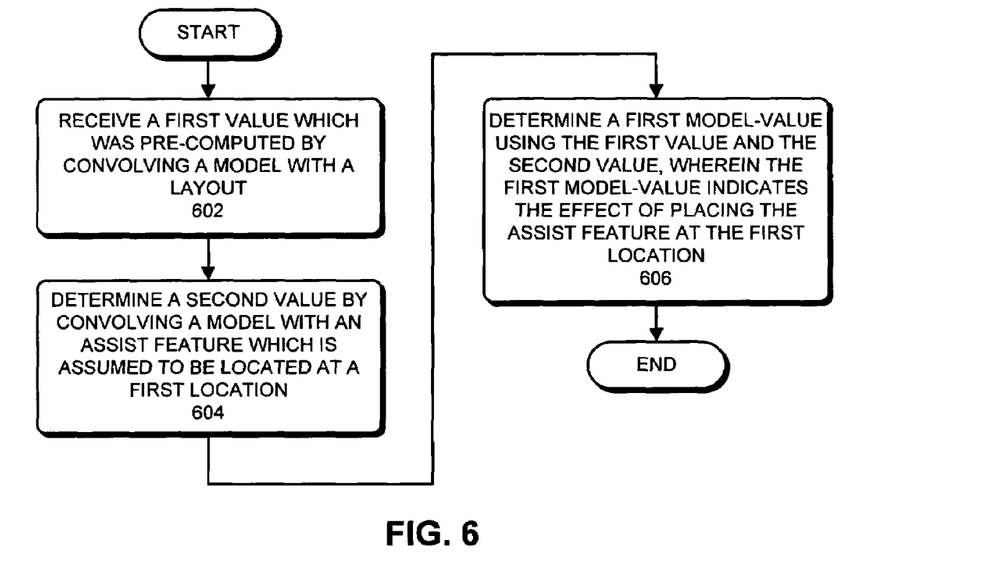
FIG. 6 presents a flowchart that illustrates a process for quickly determining the effect of placing an assist feature at a location in a layout in accordance with an embodiment of the present invention.

FIG. 6 presents a flowchart that illustrates a process for quickly determining the effect of placing an assist feature at a location in a layout in accordance with an embodiment of the present invention.

The process can begin by receiving a first value which was pre-computed by convolving a model with a layout at an evaluation point, wherein the model models semiconductor manufacturing processes (step 602).

Although evaluation points can be located anywhere in the layout, they are usually located in proximity to potential manufacturing problem areas. For example, an evaluation point may be located on an edge of a polygon which is likely to have manufacturing problems.

In one embodiment, the model can be a process-sensitivity model which can be used to estimate the through-process window at the evaluation point. Specifically, the process-sensitivity model can be represented using a set of kernels. The process-sensitivity at an evaluation point in the layout can be determined by convolving the set of kernels with the layout.

Next, the system determines a second value by convolving the model with an assist feature, which is assumed to be located at a first location which is in proximity to the evaluation point (step 604). As noted before, the model can be quickly convolved with an assist feature because the assist feature typically comprises a few simple polygons.

The system then determines a first model-value using the first value and the second value, wherein the first model-value indicates the effect of placing the assist feature at the first location (step 608).

If a process-sensitivity model is used, the first model value can be a process-sensitivity value which indicates the through-process window at the evaluation point.

Note that the system can determine a substantially optimal location for placing the assist feature. For example, in one embodiment, the system can determine a third value by convolving the model with the assist feature, which is assumed to be located at a second location which is in proximity to the evaluation point. Next, the system can determine a second model-value using the first value and the third value, wherein the second model-value indicates the effect of placing the assist feature at the second location. Finally, the system can determine a third location for placing the assist feature using the first model-value and the second model-value. Specifically, the third location can be a substantially optimal location. Placing the assist feature at the third location can substantially increase the through-process window at the evaluation point, thereby improving the manufacturability of the layout.

A general technique for determining a location (e.g., a substantially optimal location) for placing an assist feature is described below.

Determining a Location for Placing an Assist Feature

Figure 7:
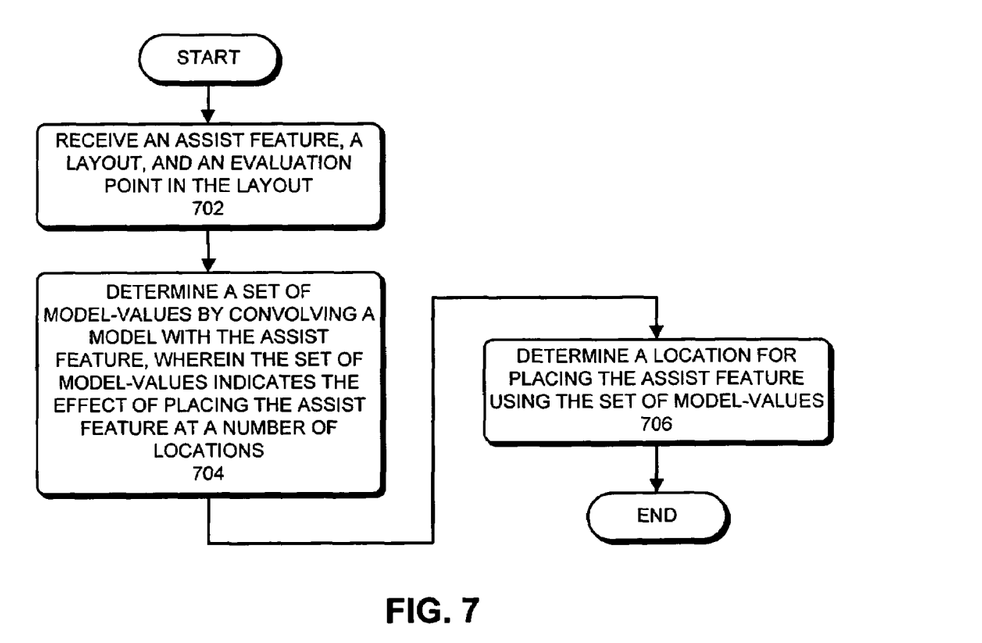
FIG. 7 presents a flowchart that illustrates a process to determine a location for placing an assist feature in accordance with an embodiment of the present invention.

FIG. 7 presents a flowchart that illustrates a process to determine a location for placing an assist feature in accordance with an embodiment of the present invention.

The process can begin by receiving an assist feature, a layout, and an evaluation point in the layout (step 702).

Figure 8A:
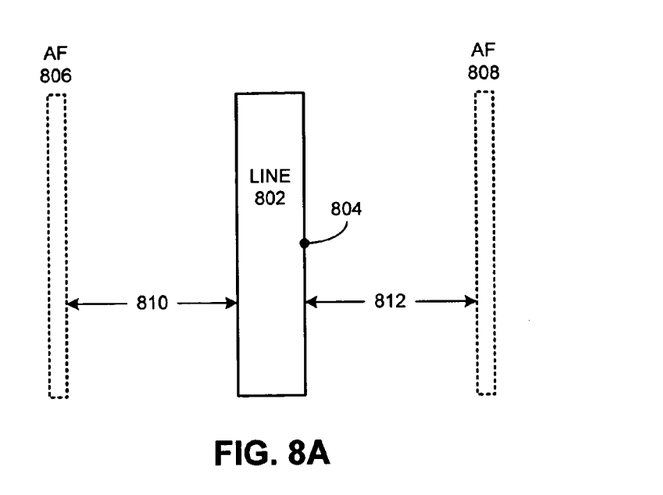
FIG. 8A illustrates a portion of a layout in accordance with an embodiment of the present invention.

FIG. 8A illustrates a portion of a layout in accordance with an embodiment of the present invention.

For the sake of clarity and ease of discourse, FIG. 8A illustrates a portion of a layout which comprises a single line 802. In a more realistic example, a portion of a layout would most likely contain many more polygons. (Note that, although only the polygons in the neighborhood of an evaluation point usually affect the model-value at the evaluation point, the number of such polygons can be quite large.)

Continuing with the flowchart in FIG. 7, the system then determines a set of model-values at the evaluation point by convolving a model with the assist feature, wherein the set of model-values indicate the effect of placing the assist feature at a number of locations in the proximity of the evaluation point (step 704).

The model-values can represent the image intensity, the gradient of the image intensity, the process-sensitivity, or any other measurable wafer parameter that is desired to be optimized. Specifically, the model can be a process-sensitivity model which can be used to estimate the through-process window at the evaluation point.

For example, let us assume that we are interested in determining, at evaluation point 804, the effect of placing assist features 806 and 808. Specifically, let us assume that we want to determine substantially optimal distances 810 and 812 for placing the assist features, thereby substantially minimizing (or substantially maximizing) a desired quantity at the evaluation point. (In the present example, the present invention is being used to simultaneously determine the placement of two assist features. In general, the present invention can be used to simultaneously determine the placement of one or more assist features.)

The system can locate the assist features 806 and 808 at a number of locations. Next, the system can determine a set of model-values at evaluation point 804 by convolving a model with the assist features which are assumed to be placed at the different locations. Specifically, the set of model-values can be plotted against the assist feature locations.

Figure 8B:
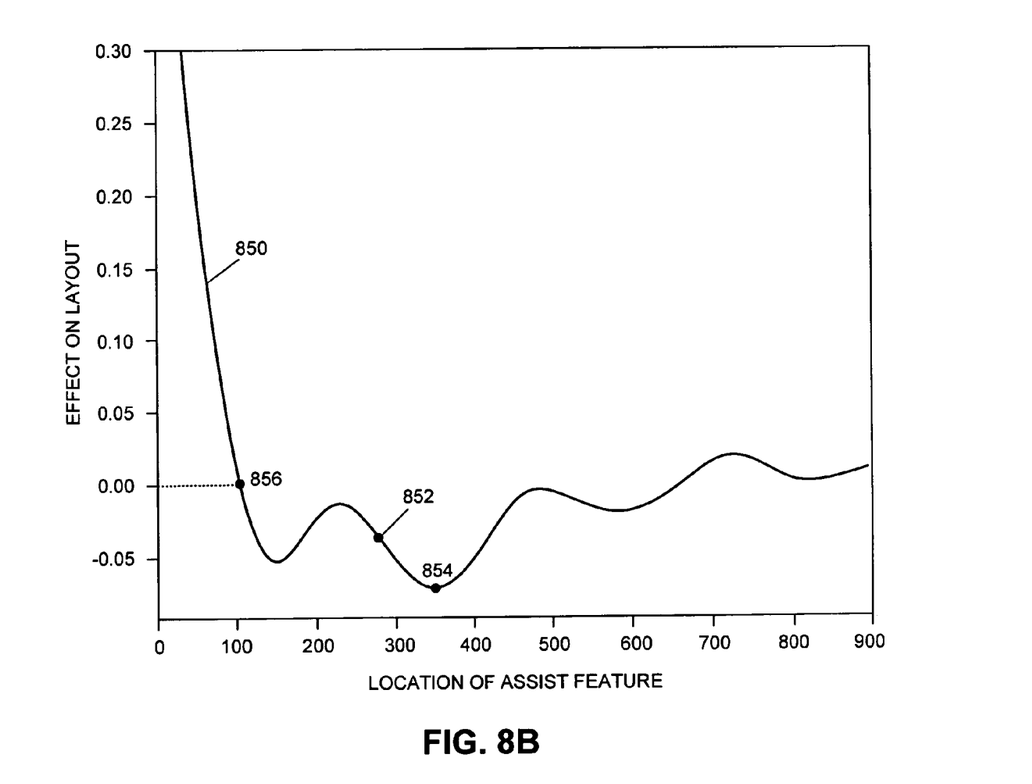
FIG. 8B illustrates a plot which represents the effect of placing an assist feature at a location in a layout in accordance with an embodiment of the present invention.

FIG. 8B illustrates a plot which represents the effect of placing an assist feature at a location in a layout in accordance with an embodiment of the present invention.

The set of model-values can be plotted against the assist feature distance to obtain curve 850. The model-value at the evaluation point is given by the ordinate of a point (e.g., point 852) on the curve, whereas the distance of the assist feature from the line is given by the abscissa of the point.

The system then determines a first location for placing the assist feature using the set of model-values (step 706).

For example, the system can determine the first location using a local minimum 854 of curve 850. Alternatively, the system can determine the first location using a root 856 of the curve.

In one embodiment, placing the assist feature at the first location can increase the through-process window at the evaluation point, thereby improving the manufacturability of the layout.

To summarize, the present invention substantially reduces the amount of computation required to determine the effect of placing an assist feature. This is because the present invention separates the computation into two terms. A first term involves a convolution of a model with the layout, whereas a second term involves a convolution of the model with the assist feature. Since the first term can require a large amount of computation, embodiments of the present invention usually pre-compute this term and store it in a database. On the other hand, the second term can be quickly determined, and hence, this term is typically determined during operation (e.g., run-time). In contrast, prior art techniques do not separate the convolution computation into two terms. Hence, prior art techniques usually require a substantially large amount of computation during operation.

CONCLUSION

The data structures and code described in the foregoing description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), or any device capable of storing data usable by a computer system.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art.

For example, although the present invention has been described in the context of placing assist features, the present invention can be used for placing shifters in a PSM (Phase-Shift Mask).

Additionally, the above disclosure is not intended to limit the present invention. The scope of the present invention is defined by the appended claims.

What is claimed is:

1. A method for determining the effect of placing an assist feature at a location in a layout, the method comprising:

using one or more computers for:

retrieving a first value which was pre-computed by convolving a model with a layout at an evaluation point, wherein the layout does not include an assist feature at a first location, and wherein the model models one or more semiconductor manufacturing processes;

determining a second value by convolving, at the evaluation point, the model with the assist feature which is assumed to be located at the first location, wherein determining the second value does not involve convolving the model with the layout; and determining a first model-value using the first value and the second value, wherein the first model-value indicates the effect of placing the assist feature at the first location.

2. The method of claim 1, further comprising:

determining a third value by convolving the model with the assist feature, which is assumed to be located at a second location which is in proximity to the evaluation point;

determining a second model-value using the first value and the third value, wherein the second model-value indicates the effect of placing the assist feature at the second location; and determining a third location for placing the assist feature using the first model-value and the second model-value.

3. The method of claim 2, wherein placing the assist feature at the third location increases the through-process window at the evaluation point, thereby improving the manufacturability of the layout.

4. The method of claim 1,
wherein the model is a process-sensitivity model; and
wherein the first model-value is a process-sensitivity value which indicates the through-process window at the evaluation point.

5. The method of claim 4, wherein the process-sensitivity model is determined by:

receiving an on-target process model that models semiconductor manufacturing processes under a first set of process conditions;

receiving an off-target process model that models semiconductor manufacturing processes under a second set of process conditions, which are different from the first set of process conditions; and determining the process-sensitivity model using the on-target process model and the off-target process model.

6. A computer-readable storage medium storing instructions that when executed by a computer cause the computer to perform a method for determining the effect of placing an assist feature at a location in a layout, the method comprising:

retrieving a first value which was pre-computed by convolving a model with a layout at an evaluation point, wherein the layout does not include an assist feature at a first location, and wherein the model models one or more semiconductor manufacturing processes;

determining at a second value by convolving, at the evaluation point, the model with the assist feature which is assumed to be located at the first location, wherein determining the second value does not involve convolving the model with the layout; and determining a first model-value using the first value and the second value, wherein the first model-value indicates the effect of placing the assist feature at the first location.

7. The computer-readable storage medium of claim 6, the method further comprising:

determining a third value by convolving the model with the assist feature, which is assumed to be located at a second location which is in proximity to the evaluation point;

determining a second model-value using the first value and the third value, wherein the second model-value indicates the effect of placing the assist feature at the second location; and determining a third location for placing the assist feature using the first model-value and the second model-value.

8. The computer-readable storage medium of claim 7, wherein placing the assist feature at the third location increases the through-process window at the evaluation point, thereby improving the manufacturability of the layout.

9. The computer-readable storage medium of claim 6,
wherein the model is a process-sensitivity model; and
wherein the first model-value is a process-sensitivity value which indicates the through-process window at the evaluation point.

10. The computer-readable storage medium of claim 9, wherein the process-sensitivity model is determined by:

receiving an on-target process model that models semiconductor manufacturing processes under a first set of process conditions;

receiving an off-target process model that models semiconductor manufacturing processes under a second set of process conditions, which are different from the first set of process conditions; and determining the process-sensitivity model using the on-target process model and the off-target process model.

11. A method to determine a location for placing an assist feature, the method comprising:

using one or more computers for:

receiving an assist feature, a layout, and an evaluation point in the layout, wherein the layout does not include assist features at a set of locations;

determining a set of model-values at the evaluation point by:

retrieving a first value which was pre-computed by convolving a model with the layout at the evaluation point, wherein the model models one or more semiconductor manufacturing processes;

determining a second value by convolving, at the evaluation point, the model with the assist feature which is assumed to be located at a location in the set of locations, wherein determining the second value does not involve convolving the model with the layout; and determining a model-value in the set of model-values using the first value and the second value, wherein the model-value in the set of model-values indicates the effect of placing the assist feature at the location in the set of locations; and determining a first location for placing the assist feature using the set of model-values.

12. The method of claim 11,
wherein the model is a process-sensitivity model; and
wherein a model-value is a process-sensitivity value which indicates the through-process window at the evaluation point.

13. The method of claim 12, wherein the process-sensitivity model is determined by:

receiving an on-target process model that models semiconductor manufacturing processes under a first set of process conditions;

receiving an off-target process model that models semiconductor manufacturing processes under a second set of process conditions, which are different from the first set of process conditions; and determining the process-sensitivity model using the on-target process model and the off-target process model.

14. The method of claim 11, wherein placing the assist feature at the first location increases the through-process window at the evaluation point, thereby improving the manufacturability of the layout.

15. A computer-readable storage medium storing instructions that when executed by a computer cause the computer to perform a method to determine a location for placing an assist feature, the method comprising:
- receiving an assist feature, a layout, and an evaluation point in the layout, wherein the layout does not include assist features at a set of locations;
- determining a set of model-values at the evaluation point by:
  - retrieving a first value which was pre-computed by convolving a model with the layout at the evaluation point, wherein the model models one or more semiconductor manufacturing processes;
  - determining a second value by convolving, at the evaluation point, the model with the assist feature which is assumed to be located at a location in the set of locations, wherein determining the second value does not involve convolving the model with the layout; and
  - determining a model-value in the set of model-values using the first value and the second value, wherein the model-value in the set of model-values indicates the effect of placing the assist feature at the location in the set of locations; and
- determining a first location for placing the assist feature using the set of model-values.

16. The computer-readable storage medium of claim 15, wherein the model is a process-sensitivity model; and
wherein a model-value is a process-sensitivity value which indicates the through-process window at the evaluation point.

17. The computer-readable storage medium of claim 16, wherein the process-sensitivity model is determined by:
- receiving an on-target process model that models semiconductor manufacturing processes under a first set of process conditions;
- receiving an off-target process model that models semiconductor manufacturing processes under a second set of process conditions, which are different from the first set of process conditions; and
- determining the process-sensitivity model using the on-target process model and the off-target process model.

18. The computer-readable storage medium of claim 15, wherein placing the assist feature at the first location increases the through-process window at the evaluation point, thereby improving the manufacturability of the layout.

* * * * *